(12) United States Patent
Tsern et al.

(10) Patent No.: US 7,142,475 B2
(45) Date of Patent: *Nov. 28, 2006

(54) MEMORY DEVICE HAVING A CONFIGURABLE OSCILLATOR FOR REFRESH OPERATION

(75) Inventors: Ely K. Tsern, Los Altos, CA (US); Richard M. Barth, Palo Alto, CA (US); Paul G. Davis, San Jose, CA (US); Craig E. Hampel, San Jose, CA (US)

(73) Assignee: Rambus, Inc., Los Altos, CA (US)

( * ) Notice: Subject to any disclaimer, the term of this patent is extended or adjusted under 35 U.S.C. 154(b) by 16 days.

This patent is subject to a terminal disclaimer.

(21) Appl. No.: 10/917,748

(22) Filed: Aug. 13, 2004

(65) Prior Publication Data

US 2005/0041501 A1 Feb. 24, 2005

Related U.S. Application Data

(60) Continuation of application No. 10/625,914, filed on Jul. 22, 2003, now Pat. No. 6,778,458, which is a continuation of application No. 10/066,042, filed on Jan. 29, 2002, now Pat. No. 6,597,616, which is a continuation of application No. 09/561,592, filed on Apr. 27, 2000, now Pat. No. 6,343,042, which is a division of application No. 09/169,376, filed on Oct. 9, 1998, now Pat. No. 6,075,744

(60) Provisional application No. 60/061,767, filed on Oct. 10, 1997.

(51) Int. Cl.
*G11C 7/00* (2006.01)

(52) U.S. Cl. .................... 365/222; 365/230.03; 365/236

(58) Field of Classification Search ................ 365/222, 365/230.03, 236, 206, 203, 233
See application file for complete search history.

(56) References Cited

U.S. PATENT DOCUMENTS

| | | | |
|---|---|---|---|
| 4,716,551 A | 12/1987 | Inagaki | 365/222 |
| 4,807,197 A | 2/1989 | Watanabe | 365/222 |
| 4,870,622 A | 9/1989 | Aria et al. | 365/230.02 |
| 4,912,678 A | 3/1990 | Mashiko | 365/222 |
| 5,243,576 A * | 9/1993 | Ishikawa | 365/222 |
| 5,272,676 A | 12/1993 | Kubono et al. | 365/222 |
| 5,321,661 A | 6/1994 | Iwakiri et al. | 365/222 |
| 5,349,562 A | 9/1994 | Tanizaki | 365/193 |
| 5,367,493 A | 11/1994 | Yamagata | 365/222 |
| 5,375,093 A | 12/1994 | Hirano | 365/222 |
| 5,392,251 A | 2/1995 | Manning | 365/222 |
| 5,410,510 A | 4/1995 | Smith et al. | 365/201 |
| 5,442,588 A | 8/1995 | Runas | 365/222 |
| 5,446,696 A | 8/1995 | Ware et al. | 365/222 |
| 5,450,364 A * | 9/1995 | Stephens et al. | 365/222 |
| 5,495,452 A | 2/1996 | Cha | 365/222 |

(Continued)

FOREIGN PATENT DOCUMENTS

JP 08077769 3/1996 ................... 11/406

OTHER PUBLICATIONS

Choi et al., "Battery Operated 16M DRAM with Post Package Programmable and Variable Self Refresh", *IEEE*, Symposium on VLSI Circuits Digest of Technical Papers, pp. 83–84 (1994).

(Continued)

*Primary Examiner*—David Lam
(74) *Attorney, Agent, or Firm*—Morgan, Lewis & Bockius LLP

(57) ABSTRACT

A dynamic random access memory device includes banks of dynamic memory cells. The device performs a refresh operation in response to receiving a self refresh command, by refreshing rows of the memory cells located in each of the banks. Further, a refresh frequency for the refresh operation is selected such that the refresh frequency is minimized to conserve power consumed by the memory device while being sufficient to refresh the rows of the memory cells.

20 Claims, 8 Drawing Sheets

U.S. PATENT DOCUMENTS

| | | |
|---|---|---|
| 5,508,965 A | 4/1996 | Nomura et al. ............. 365/206 |
| 5,511,033 A | 4/1996 | Jung ......................... 365/222 |
| 5,532,968 A | 7/1996 | Lee ........................... 365/222 |
| 5,539,703 A | 7/1996 | Manning .................... 365/222 |
| 5,566,117 A | 10/1996 | Okamura et al. ........... 365/222 |
| 5,627,791 A | 5/1997 | Wright et al. ............... 365/222 |
| 5,636,171 A | 6/1997 | Yoo et al. ................... 365/222 |
| 5,654,930 A | 8/1997 | Yoo et al. ................... 365/222 |
| 5,659,515 A * | 8/1997 | Matsuo et al. ............. 365/222 |
| 5,666,322 A | 9/1997 | Conkle ....................... 365/222 |
| 5,680,359 A | 10/1997 | Jeong ......................... 708/620 |
| 5,684,751 A | 11/1997 | Manning .................... 365/222 |
| 5,717,644 A | 2/1998 | Hadderman et al. ........ 365/222 |
| 5,726,943 A | 3/1998 | Yamagata et al. .......... 365/222 |
| 5,774,409 A | 6/1998 | Yamazaki et al. ..... 365/230.03 |
| 5,777,939 A | 7/1998 | Won ........................... 365/222 |
| 5,798,976 A | 8/1998 | Arimoto ..................... 356/222 |
| 6,075,744 A | 6/2000 | Tsern et al. ............ 365/230.03 |
| 6,097,658 A | 8/2000 | Satoh et al. ................ 365/222 |
| 6,141,280 A | 10/2000 | Cho ............................ 365/222 |
| 6,266,292 B1 | 7/2001 | Tsern et al. ............ 365/230.03 |
| 6,778,458 B1 * | 8/2004 | Tsern et al. ................. 365/222 |

OTHER PUBLICATIONS

Kagenishi, "Low Power Self Refresh Mode DRAM with Temperature Detecting Circuit", *IEEE*, Symposium on VLSI Circuits Digest of Technical Papers, pp. 43–44 (1993).

Yamauchi et al., "A Circuit Technology for a Self–Refresh 16Mb DRAM with Less than 0.5 µA/MB Data–Retention Current", *IEEE J. of Solid–State Circuits*, 30(11):1174–1182 (1995).

Yoo et al., "A 256M DRAM With Simplified Register Control for Low Power Self Refresh and Rapid Burn–In", *IEEE*, Symposium on VLSI Circuits Digest of Technical Papers, pp. 85–86 (1994).

Yoo et al., "Variable Vcc Design Techniques for Battery Operated DRAMs", *IEEE*, Symposium on VLSI Circuits Digest of Technical Papers, pp. 110–111 (1992).

EIA/JEDEC Minutes of Meeting No. 59, JC–42.3 Committee on RAM Memories, Philadelphia, PA (Sep. 18, 1991).

* cited by examiner

MEMORY DEVICE HAVING A CONFIGURABLE OSCILLATOR FOR REFRESH OPERATION

This application is a continuation of U.S. patent application Ser. No. 10/625,914. filed Jul. 22, 2003 now U.S. Pat. No. 6,778,458, which was a continuation of U.S. patent application Ser. No. 10/066,042, filed Jan. 29, 2002, now U.S. Pat. No. 6,597,616 B2, which was a continuation of U.S. patent application Ser. No. 09/561,592, filed Apr. 27, 2000, now U.S. Pat. No. 6,343,042, which was a divisional continuation of U.S. patent application Ser. No. 09/169,376, filed Oct. 9, 1998, now U.S. Pat. No. 6,075,744, and claims priority to the provisional patent application entitled, "DRAM Core Refresh with Reduced Overhead", Ser. No. 60/061,767, filed Oct. 10, 1997.

BACKGROUND OF THE INVENTION

The present invention relates to dynamic random access memories (DRAMs), and in particular to refreshing techniques.

DRAM devices function by storing charge on a capacitor at each memory location. The capacitor loses the charge over time, and accordingly it needs to be recharged to its original level, whether a 1 or 0, periodically. This period is known as the refresh period, tREF. A typical tREF value is 64 ms. This recharging is termed refreshing, and is done by doing a row access for every row in the memory device. In newer DRAM designs, the rows and columns are broken into multiple banks to break down large DRAM arrays into smaller pieces.

The row access operation is performed in two steps. First, a row is opened, or turned on, in a "sense" operation, by turning on the sense amps. Next, the row is closed by doing a "precharge" operation, using a precharge equalization transistor. When a refresh is performed, there is no need to select a particular bit with a column address, and the data is not read.

As the storage capacity of memory devices increases and the number of banks per device increases, the issue rate of refresh commands sent to the memory device from the controller also increases and can introduce a refresh overhead that unacceptably impacts the performance of normal memory accesses.

To reduce refresh overhead, it is desirable to refresh more than one bank for each refresh command. This approach can be called multibank refresh. With a given refresh command, more than one bank could be either simultaneously or sequentially refreshed. From a performance standpoint, it is more desirable to refresh banks simultaneously, so that the time that bank resources are tied up is minimized.

Simultaneous multibank refresh, however, has the problem of current spikes. Each refresh operation for each bank requires a certain amount of supply current over time. At the onset of the operation, there is an initial spike of current. This spike is large because the row sensing circuits have been designed to access cell data as quickly as possible in order to minimize the latency to the first allowable page access to bits stored in the sense amps. This spike, characterized by rate of change in current, dI/dt, can cause noise problems in a DRAM, since current spikes can reduce the internal supply voltage and cause failure in circuits on the same die or on other devices that share the same supply voltage. With multiple banks simultaneously doing a row sense, the current spike effect can be additive, thus causing greater probability of circuit failure.

Typically, a refresh operation is done by periodically addressing every row with a controller. Thus, interspersed between normal memory access operations, refresh commands are sent in the form of a RAS control signal with a row address. In a prior RAMBUS memory system, these commands are sent in packets which are decoded in the memory chips themselves.

In addition to the normal refreshing interspersed with memory accesses, the memory may also be put into a sleep or stand-by mode. In this mode, it is not being accessed, and minimal power drain is desired. This is accomplished by simply refreshing the memory when needed, and otherwise not doing memory accesses. Memory chips typically have on-chip counters for sequencing through all the rows and banks in order to accomplish such a self-refresh. This allows the memory chips to refresh themselves, without requiring the controller to be turned on to provide it with the refresh addresses and commands.

Because self-refresh mode uses a clock or sequencer on the DRAM itself, a synchronization issue arises when the device comes out of self-refresh mode and the controller takes over memory accesses and controlling refresh. The typical way the synchronization is handled is for the microprocessor, upon powering up out of a self-refresh mode, to send a burst of refresh commands covering all the data locations in the memory chip. In this way, it is ensured that the timing of the last refresh of every memory location is known to the microprocessor.

To keep up with increasing microprocessor speeds, there has been pressure to increase the speed at which memory is accessed. One method for accomplishing this is to shape the current pulse provided by the sense amplifier driver in order to increase access speed. This is discussed, for example, in an article by H. Geib, W. Rabnd. Schmitt-Landsiedel, entitled "Block-Decoded Sense-Amplifier Driver for High-Speed Sensing in DRAM's", IEEE Journal of Solid-State Circuits, Vol. 23, No. 9, September 1992. As memories become larger, however, more locations need to be refreshed at any given time, and refreshing draws more power in a shorter time for the larger memories. Thus, current spikes can cause significant noise problems on the power line during a refresh operation. Accordingly, refresh protocols limit refreshing to one row at a time in order to control refreshing noise.

SUMMARY OF EMBODIMENTS

The present invention makes multibank refresh more practical by varying the current profile for the row sense and/or row precharge currents during a refresh operation, as compared to normal memory access. Unlike normal memory accesses, data is not needed, and a fast access time is not required. This allows the current to be spread using different circuitry for driving the current so as to lessen current spikes. The spread current is still maintained within the timing of a normal refresh or memory access.

By refreshing multiple banks in response to a single command, the present invention provides a method for reducing the communication overhead over the interface bus to the memory devices for refresh operations.

In one embodiment, the generation of row and bank addresses during refresh is split between on-chip and external commands. A row counter is provided on the memory chip, with the row counter being used for refresh operations, both normal and self-refresh. Only the bank address needs to be sent over the memory bus. Since the same row counter is used for self and normal refresh, only a burst of the banks for a particular row need to be issued to regain synchronization, since the same row counter is used in both modes.

Additionally, in the preferred embodiment, the banks occupy the least significant bits of the address, and the rows occupy the most significant bits of the address. Such an addressing scheme allows the internal row counters to be taken advantage of, and allows a transition from self-refresh to normal refresh with only a burst of the banks.

In one embodiment, the row sense or precharge currents have their profile modified by using multiple transistors in parallel, with only one or some transistors being turned on, or some or all of the transistors being sequentially turned on, so that the full current is not applied at once in the refresh mode. In normal mode, all the transistors can be turned on simultaneously for the fastest access. Alternately, the control signal provided to the sense driver or precharge driver could be ramped at a lower rate, or operate at a lower voltage to limit the current spike of the transistor.

For further understanding of the nature and advantages of the invention, reference should be made to the following description taken in conjunction with the accompanying drawings.

DETAILED DESCRIPTION OF THE PREFERRED EMBODIMENTS

As described above, dynamic random access memory (DRAM) devices require periodic operations to retain data in its storage cells. A refresh operation consists of a row sense operation and a row precharge operation. Each memory cell needs to be refreshed within a given time interval known as $t_{REF}$, the refresh period. A typical $t_{REF}$ value is 64 ms. As a result, each row in each memory bank needs to be refreshed within $t_{REF}$.

As the number of banks in memory devices increases and as the number of devices in memory systems increases, the issue rate of refresh commands sent from the controller also increases. This increased traffic due to refresh operations can introduce an overhead that unacceptably impacts performance, as measured by effective data bandwidth and memory access latency.

The present invention implements refreshing of more than one bank for each refresh command to reduce refresh overhead on the memory system bus. This approach is called multibank refreshing. With a given refresh command, either more than one bank is simultaneously refreshed, or more than one bank are sequentially refreshed from the same command. From the performance standpoint, it is more desirable to refresh banks simultaneously, so that the time the bank resources are tied up is minimized.

Figure 1:
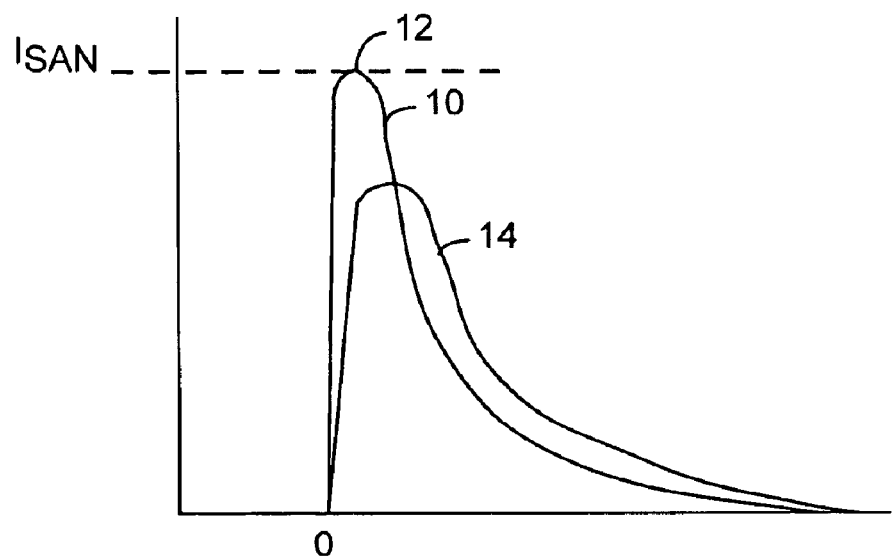
FIG. 1 is a diagram illustrating row sense current profiles.

One of the problems caused by multibank refresh is that of current spikes. Each refresh operation or each bank requires a certain amount of supply current over time. FIG. 1 shows a typical current profile 10 over time for a row sense operation. At a point 12, there is a large initial spike of current near time 0. This spike is large because the row sensing circuits have been designed to access cell data as quickly as possible in order to minimize the latency to the first allowable page access to bits stored in the sense amps. This spike, characterized by rate of change of current, dI/dt, can cause noise problems in a DRAM, since current spikes can reduce the internal supply voltage and cause failure in circuits on the same die or on other devices that share the same voltage supply. With multiple banks simultaneously doing a row sense, the current spike effect can be additive, thus causing greater probability of circuit failure.

The present invention provides methods and apparatus for reducing the current spike to give a profile such as that indicated by profile 14 in FIG. 1. This profile achieves less of a current spike, but still delivers the required current in approximately the same time. The smaller initial current spike will increase the latency for accessing data, but since data is not accessed in the refresh, this is not a concern for a refresh operation.

Figure 2:
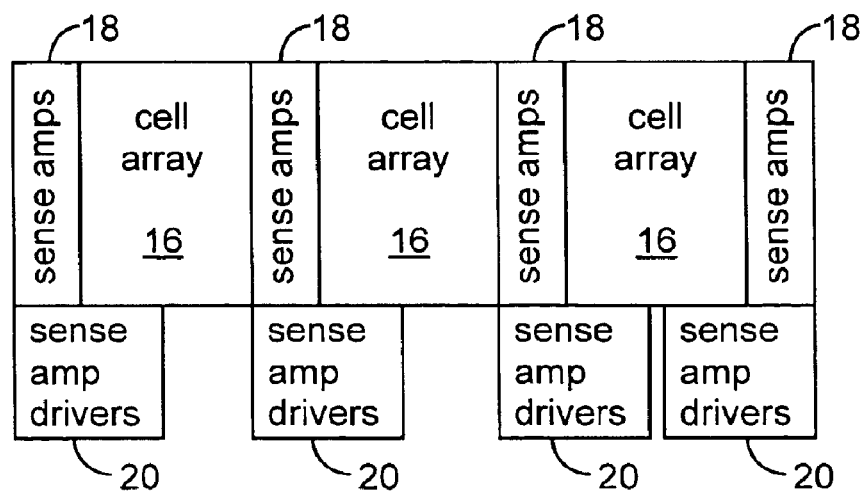
FIG. 2 is a diagram of a memory core illustrating sense amp organization.

To understand one embodiment of the invention, a brief overall description of the structure of the memory is useful. FIG. 2 shows the organization of multiple banks in a memory having a number of cell arrays 16 with sense amplifiers 18, and sense amplifier drivers 20.

Figure 3:
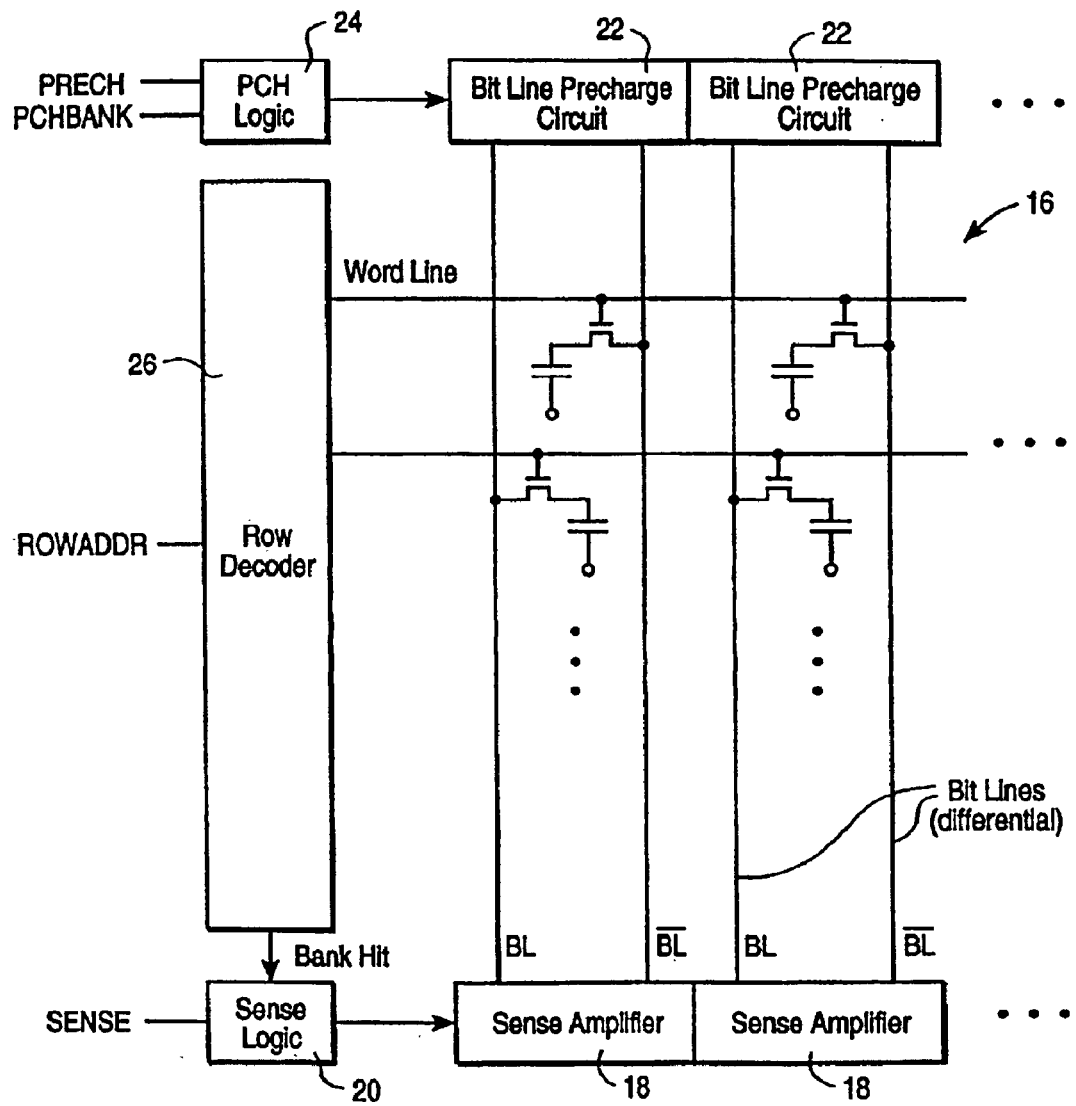
FIG. 3 is a block diagram of a portion of the logic of FIG. 2.

FIG. 3 illustrates additional logic for one cell array 16. In addition to the sense amplifier driver or logic 20 and sense amplifiers 18, there is additionally shown the bit line precharge circuits 22, with corresponding driver and logic circuit 24. Also shown is a row decoder 26 for selecting particular rows or word lines in cell array 16.

Figure 4:
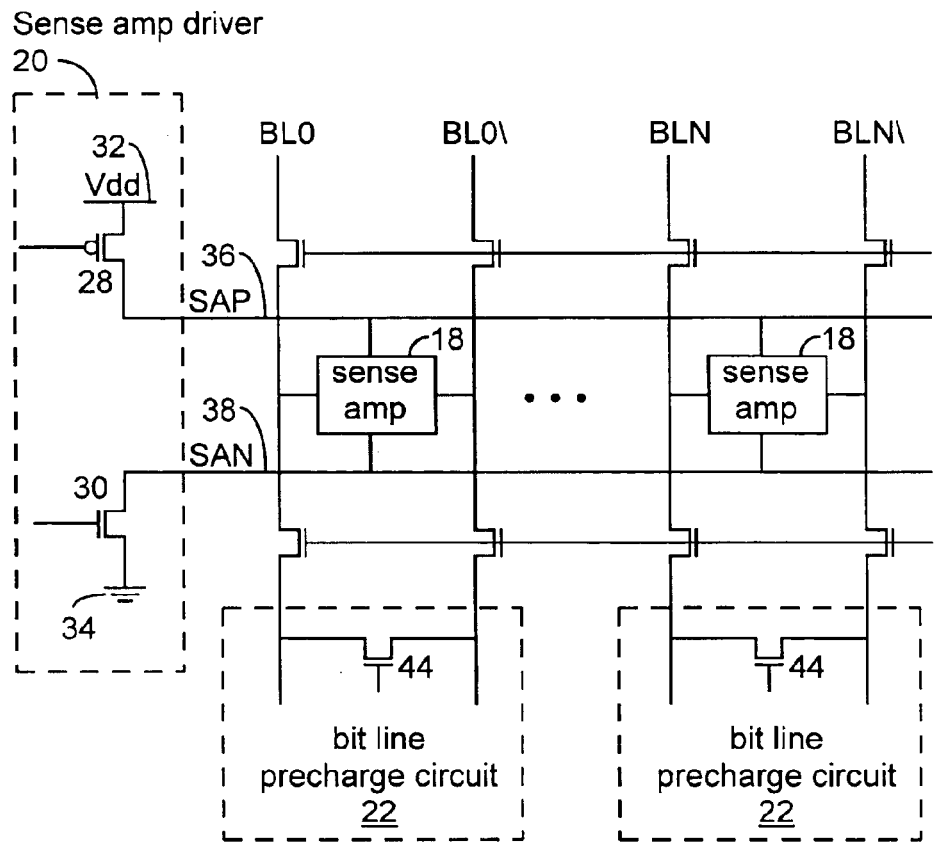
FIG. 4 is a diagram showing the sense amp drivers and pre-charge equalization transistors in the circuit of FIG. 3.

FIG. 4 illustrates some of the details of the sense amplifier driver and bit line precharge circuit 22 (also sometimes called the row precharge circuit). As shown, amplifier driver 20 includes a positive driving PMOS transistor 28, and a negative driving NMOS transistor 30. Transistor 28 is connected to a positive voltage supply 32, Vdd. Transistor 30 is connected to circuit ground 34. When activated, transistor 28 will provide a positive sense amp voltage, SAP, on drive line 36 to the sense amplifiers 18. Drive transistor 30 will provide the negative voltage level, SAN, on line 38 to the sense amplifiers.

Figure 5:
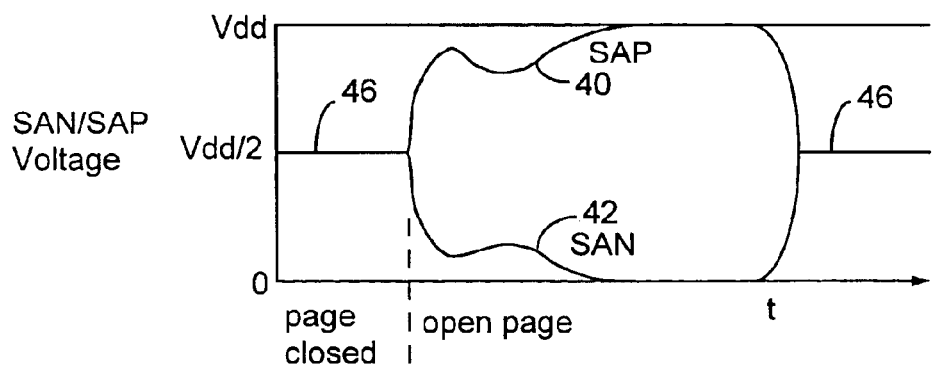
FIG. 5 is a diagram illustrating the sense amp positive and negative voltage waveforms.

FIG. 5 illustrates the voltage levels supplied to the sense amp, identified as SAP voltage waveform 40, and SAN voltage waveform 42. These voltages are applied when a page is opened, or when the sense portion of a refresh operation is initiated.

Bit line precharge circuit 22 includes a precharge equalization transistor 44. After the sense step, this transistor is activated to equalize the lines to the sense amplifiers to close a page. This brings the voltage of both bit lines, as well as the sense amp supply lines 36, 38, to a level of Vdd/2, illustrated as waveform 46 in FIG. 5.

The transitioning of the voltage levels SAP and SAN to their high and low levels as shown in FIG. 5 is what causes the current spike illustrated in FIG. 1. A similar current spike can be caused by the precharge equalization transistor.

Figure 6A:
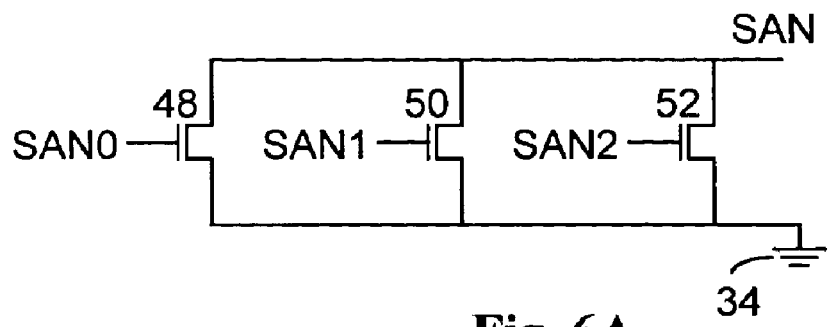
FIGS. 6A, 6B and 6C illustrate the circuit and waveforms for parallel drive transistors.
Figure 6B:
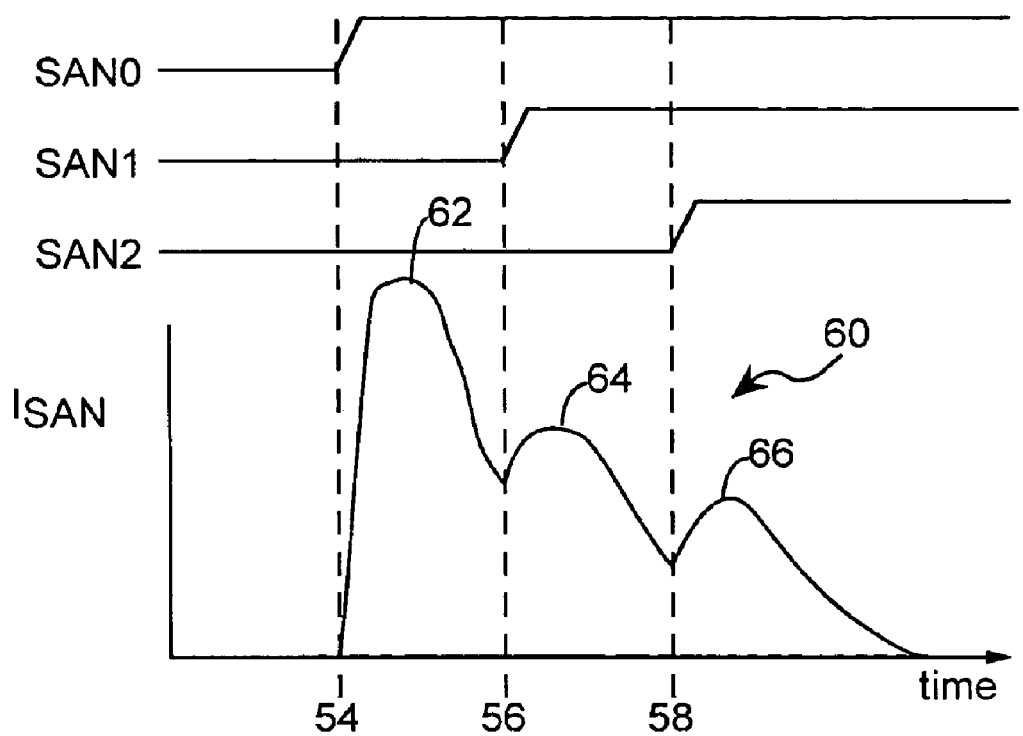

FIG. 6A is a circuit diagram of one embodiment of the invention for modifying sense amp driver transistor 30 to reduce the voltage spike. The sense amp driver transistor 30 (FIG. 4) is replaced by three driver transistors 48, 50 and 52 in parallel. By sequentially turning on these transistors, the current spike can be spread out as illustrated in FIG. 6B. FIG. 6B shows a first waveform SAN0 which will turn on transistor 48 at a time 54. A second signal, SAN1 to the gate of transistor 50, will turn transistor 50 on at a time 56. Finally, a third control signal SAN2 to the gate of transistor 52 will turn transistor 52 on at a time 58. This results in the waveform 60 of FIG. 6B, which has three smaller peaks 62, 64 and 66, instead of the combined current peak of a single transistor. The three transistors can either be of the same size, or different sizes. The first transistor turned on could be the largest transistor, or the smallest. The staggered turn-on would be used for refresh operations only, such as simultaneous multibank refresh, with all three transistors being simultaneously turned on for a normal access operation. Sense logic block 20 of FIG. 3 includes logic for determining whether the access is a refresh or normal access, and appropriately staggering the turn-on times or activating all three at the same time. Alternately, only some of the transistors could be used for refresh. Another possibility is to use extra transistors for staggered turn on for refresh, but only a single one of those transistors for a normal access.

Figure 6C:
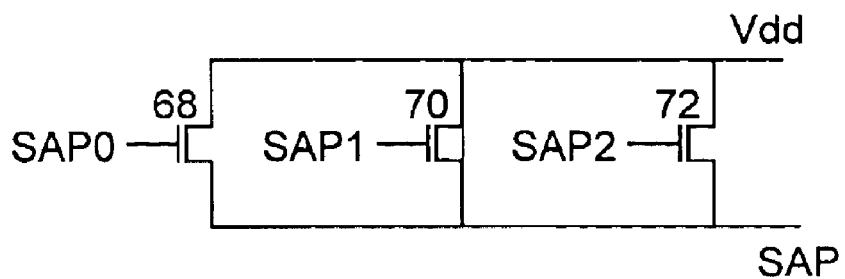

A similar circuit is shown in FIG. 6C to replace the positive sense amp circuit 28 with three parallel transistors 68, 70 and 72. Alternately, a different number of transistors than three could be used, or the number of transistors used for the SAP drive line could differ from those used for the SAN drive line.

Figure 7A:
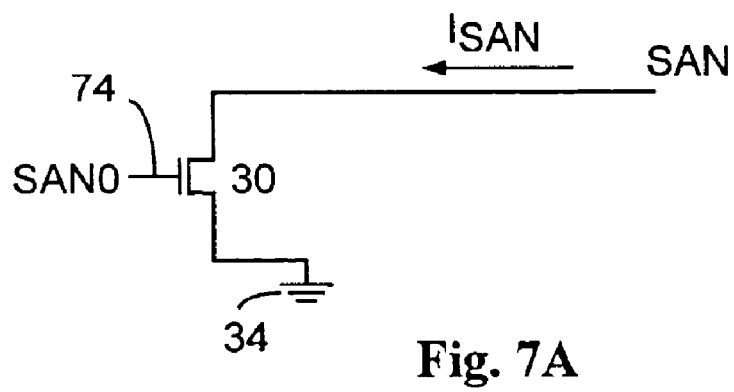
FIGS. 7A and 7B illustrate the circuit and waveforms for a drive transistor which is ramped.
Figure 7B:
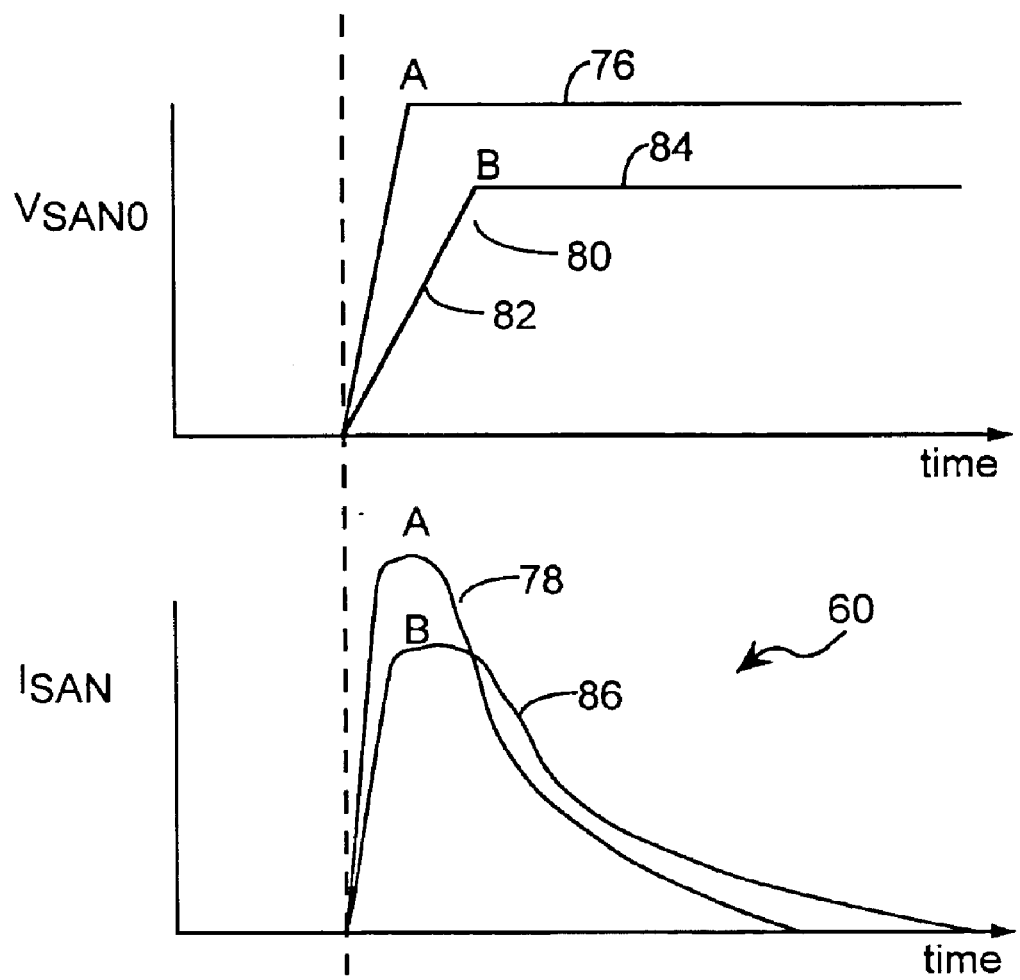

FIGS. 7A and 7B illustrate an alternate embodiment of the invention. FIG. 7A illustrates drive transistor 30 with signal SAN0 on its gate. FIG. 7B illustrates the effect of a lower slew rate and lower voltage on the control line 74 to the gate of transistor 30. Line 76 indicates a normal voltage and slew rate for turning on the gate, with its corresponding current profile 78 for the sense amp current, giving the normal spike. Line 80 illustrates a lower slew rate, indicated by ramp portion 82, and the signal also stops at a lower voltage level 84. The resulting profile is illustrated as current profile 86. As can be seen, this is effective in shaping the pulse to spread it. Again, as in the first embodiment, during normal operation voltage and slew rate 76 would be used, while for refresh operations waveform 80 would be used. A similar waveform can be used for the positive sense drive transistor 28, as well as for the precharge equalization transistor 44 of FIG. 4. In other embodiments a reduce current spike can be achieved using a slower slew rate with the normal voltage level, or by using a lower voltage level (84) with a normal slew rate.

Figure 8A:
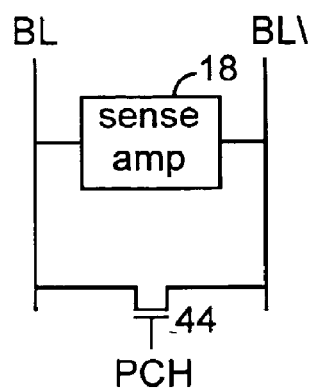
FIGS. 8A, 8B, 8C and 8D illustrate the circuit and waveforms for precharge equalization.
Figure 8B:
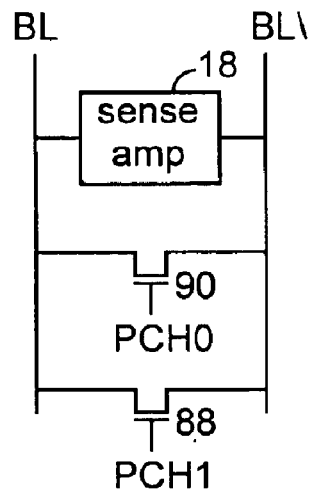
Figure 8C:
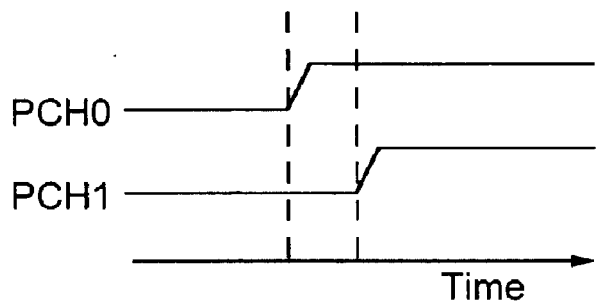
Figure 8D:
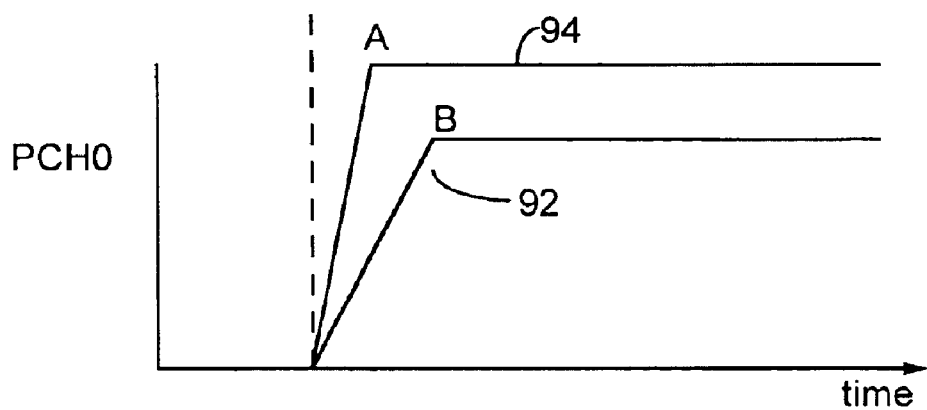

FIGS. 8A–8D illustrate similar circuits and waveforms for the precharge transistors. FIG. 8A illustrates standard precharge transistor 44 and sense amplifier 18. FIG. 8B illustrates using two precharge transistors 88 and 90, in parallel. As for the sense amp drivers, other numbers of precharged transistors could be used, and they could be of the same size or differing sizes. The gates of the transistors are shown as receiving control signals PCH0 and PCH1. FIG. 8C illustrates staggering the turn-on times of PCH0 and PCH1 to shape the pulse. FIG. 8D illustrates the use of a single transistor as in FIG. 8A, but with a lower slew rate and voltage control signal 92 being used for refresh, as contrasted with a signal 94 used during normal operations.

In one embodiment, the two methods could be combined, with multiple, parallel transistors with staggered turn-ons, and additionally having a lower voltage and slew rate applied to each of the parallel transistors.

Refresh Address Sequencing

Figure 9A:
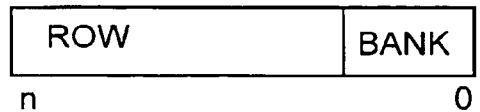
FIGS. 9A, 9B and 9C illustrate various control packets.

As illustrated in FIG. 9A, the present invention reverses the normal address sequencing of the memory core during refresh operations. Both normal refresh and self-refresh have the bank address bits as the LSBs, and the row address as the MSBs. Thus, for each row, all the banks are sequenced through before the next row is addressed. As will be discussed below, an on-chip row counter is used, so that the controller does not have to track row addresses. The sequencing of the bank addresses as the LSB works with the internal counter. The controller does not have to track row addresses during refresh, and only needs to send the bank address during each refresh operation.

Figure 9B:
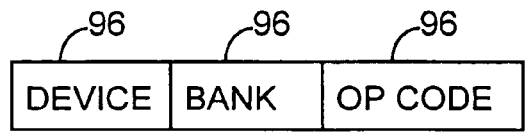
Figure 9C:
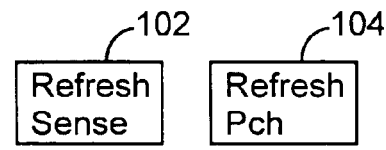

This is illustrated in FIG. 9B, which shows a primary control packet for a refresh operation as including a device field 96, a bank field 98, and an op code (refresh) 100. FIG. 9C illustrates the refresh op codes. As shown, there is both a refresh sense command 102, and a refresh precharge command 104 (also called precharge after refresh). These commands are different from a normal sense and precharge command, unlike the prior art which typically world use the same sense and precharge operations for a refresh as for a normal memory access operation.

By utilizing an internal row counter for refresh, the row address need not be transmitted in the control packet. Thus, instead of sending the first packet with the op code, and the second packet with the address, the op code can be inserted into the portion of the packet that would normally have a row address, as illustrated in FIG. 9B, saving control packet bandwidth.

Figure 10:
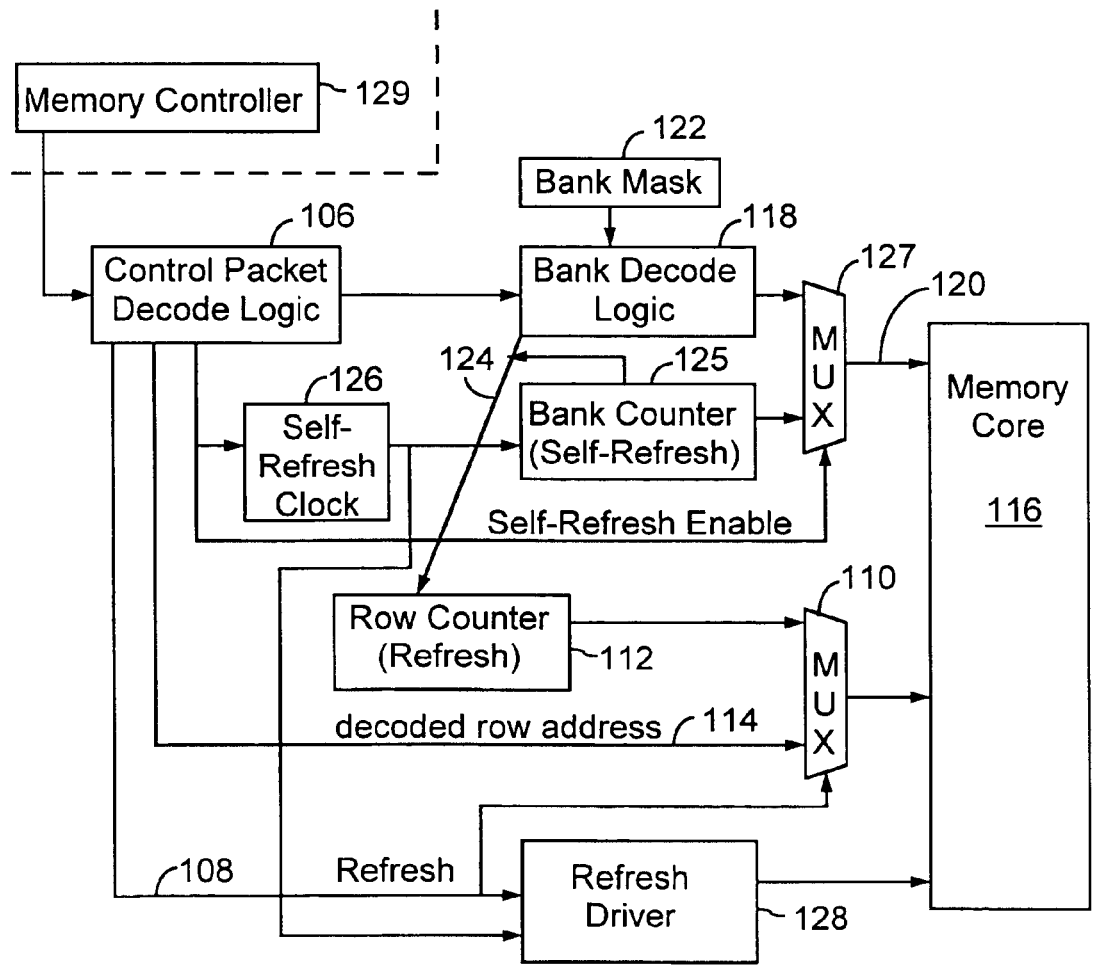
FIG. 10 is a block diagram illustrating the use of an on-chip row counter.

The use of separate refresh commands (i.e., distinct from normal memory access commands) allows the triggering of the separate pulse shaping techniques described above, and also the triggering of the internal row counter. FIG. 10 is a block diagram of the control logic for implementing the refresh operations of the invention. As shown, a control packet decode block 106 will receive the control packet. If the operation is a refresh operation, a control line 108 is asserted. This causes a multiplexer 110 to select an output from the internal row counter 112. In contrast, for normal non-refresh operations, the row address will be provided on line 114 through multiplexer 110 to memory core 116. Bank decode logic 118 will decode the bank and provide it on control lines 120 to memory core 116. For a refresh operation, a bank mask 122 or other logic may be used to enable multibank refresh for multiple banks to be simultaneously enabled.

In multiple bank refresh, the appropriate number of MSB's from the bank address can be ignored. For example, a device with 16 banks with ⅛ activation (two banks simultaneously refreshed) would ignore one MSB of the bank address so that a bank address X000 would activate banks 0 and 8. With ¼ activation, two MSB bits are ignored, and a bank address of XX00 would activate banks 0, 4, 8 and 12. The DRAM design will assign these addresses to banks with dependent bank cores, so that no two adjacent banks are simultaneously activated. Although this multibank addressing scheme naturally supports the most straight-forward sequential address assignment to banks, other assignments are possible.

For the address sequencing, each refresh sense command and each precharge after refresh command includes a bank address. Bank decode logic 118 will compare the bank address to the maximum bank address. When the maximum bank address has been reached, indicating that all banks for a particular row have been refreshed, the bank decode logic 118 sends an increment signal on a line 124 to row counter 112 to increment the row count for the next sequencing of banks. After the maximum row has been sequenced through, the row counter is reset to zero. Thus, by using the bank address as the LSB portion of the address field, all banks are refreshed before the refresh row address counter is incremented. This arrangement of the row and bank addresses allows simple support for multiple page sizes, since the appropriate number of most significant bits (MSB's) can be ignored.

For self-refresh, the control logic of FIG. 10 includes a bank address counter 125, which generates a sequence of bank addresses at a rate determined by a self-refresh clock 126. When the bank address counter 125 reaches a maximum bank address, indicating that all banks for a particular row have been refreshed, it sends an increment signal on line 124 to row counter 112 to increment the row count for the next sequencing of banks.

Each pulse output by the self-refresh clock 126, in addition to incrementing the bank counter 125, also triggers the refresh driver 128 for driving the sense amplifiers in the memory core so as to perform a refresh operation. The refresh driver 128 is also triggered by the control packet decoder logic 106 when a refresh command is received from the memory controller 129.

The control packet decode logic 106 outputs a Self-Refresh Enable signal when a self-refresh command is received from the memory controller. The self-refresh enable signal enables operation of the self-refresh clock 126, and is also used as a select signal for a bank address multiplexer 127. Multiplexer 127 sends to the memory core 116 the bank address generated by the bank address counter 125 during self-refresh, and otherwise sends the bank address generated by the bank address decode logic 118.

Self-Refresh Resynchronization

The present invention avoids problems in the prior art of resynchronizing when entering or exiting self-refresh. By using a row counter for both self-refresh and normal refresh, no resynchronization of the rows is needed at all. To handle the resynchronization of the banks, a burst of refresh commands addressing all the banks can be sent by the controller upon the exit from the self-refresh mode. This insures that every bank in the last row has indeed been refreshed before the external controller takes over the task of generating the bank addresses.

Binning

Figure 11A:
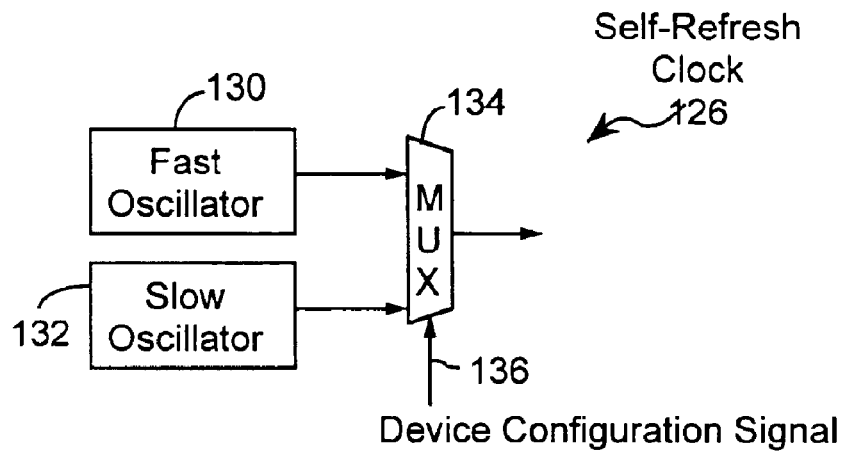
FIGS. 11A, 11B and 11C are diagrams of fast and slow clock circuits for low power binning according to self-refresh power.

In a low power mode, it is desirable to do self-refresh at a slower frequency, so as to use less power. At the same time, the refresh must be done sufficiently fast enough to maintain the data stored in the DRAM cells. Typically, a clock frequency is chosen which is sufficiently fast so that it will be able to provide the self-refresh timing regardless of variations in device parameters and cell hold time in a particular DRAM. However, some DRAMs may end up having longer cell hold times, and need less frequent refreshes. Accordingly, to take advantage of this, in one embodiment the self-refresh clock 126 uses two internal row counter oscillator circuits, as shown in FIG. 11A. A fast oscillator 130 and a slow oscillator 132 are both provided. Note that fast and slow are relative terms, and the varying speeds can be in fact somewhat close. A multiplexer 134 selects between the two oscillators. After the device is manufactured, the worst cell hold time for the memory cells in a particular DRAM chip is measured, and the fast or slow oscillator is selected by a control signal on line 136, which can be set by blowing a fuse or otherwise to pull it high or low. The control signal on line 136 is a device configuration signal that, in effect, configures the memory device for a particular mode of operation. In this manner, if a particular DRAM chip has a long hold time in its memory cells, the slower clock can be activated for the self-refresh, and the DRAM can be placed into a bin for use in laptop computers or other computers requiring lower power devices.

Figure 11B:
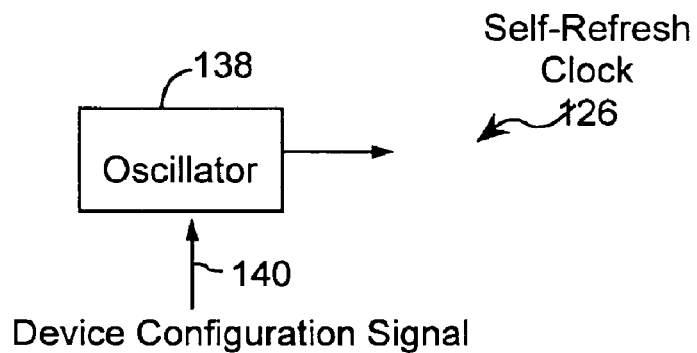
Figure 11C:
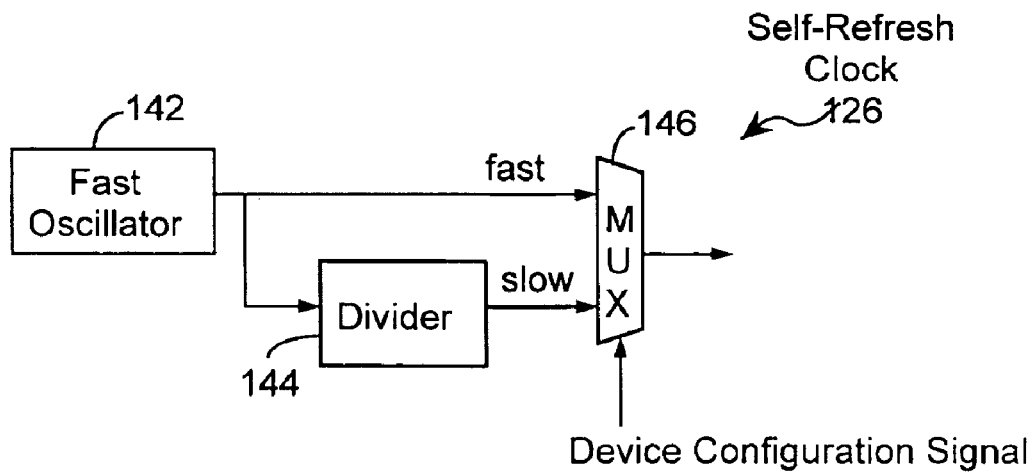

FIGS. 11B and 11C illustrate alternate embodiments. In FIG. 11B, the self-refresh clock 126 uses a single oscillator 138, with a control input 140 (i.e., the aforementioned device configuration signal) varying the speed of oscillation of the single oscillator. In this embodiment, the oscillator 138 may be capable of two or more distinct oscillation speeds, and thus the control (device configuration) signal may be set to any of a corresponding set of two or more predefined signal values. Alternately, in this embodiment the device configuration signal may be implemented as a set of one or more fuses that form part of the self-refresh clock and which determine the frequency of the oscillator, depending on which of the fuses form open circuits and which form closed circuits.

FIG. 11C shows a self-refresh clock having a single fast oscillator 142, with a divider 144 providing the slower clock, which can then be selected through a multiplexer 146.

As will be understood by those of skill in the art, the present invention may be embodied in other specific forms without departing from the spirit or essential characteristics thereof. Accordingly the foregoing description is intended to be illustrative, but not limiting, of the scope of the invention as set forth in the following claims.

What is claimed is:

1. A method of operation in a dynamic random access memory device that includes banks of dynamic memory cells, the method comprising:
   receiving a self refresh command, wherein the memory device performs a refresh operation in response to the self refresh command;
   refreshing rows of the memory cells located in each of the banks during the refresh operation; and
   selecting a refresh frequency for the refresh operation in response to a control signal, wherein the refresh frequency is selectable from at least a first refresh frequency and a second refresh frequency, wherein the first refresh frequency is lower than the second refresh frequency, wherein selecting the refresh frequency includes configuring an oscillator in response to the control signal, and wherein the oscillator generates an internal refresh clock used in refreshing the rows of the memory cells.

2. The method of claim 1, wherein the internal refresh clock triggers an internal refresh driver that energizes sense amplifiers corresponding to a row of the rows being refreshed during the refresh operation.

3. The method of claim 1, wherein configuring the oscillator includes blowing a fuse to generate the control signal.

4. The method of claim, wherein the first refresh frequency is minimized relative to the second refresh frequency to conserve power while being sufficient to refresh the rows of the memory cells.

5. The method of claim 1, wherein the oscillator is configured by dividing the output of the oscillator in response to the control signal to generate a divided clock signal that is selected as the internal refresh clock.

6. The method of claim 1, further including incrementing a counter that holds a row address corresponding to the rows of the memory cells located in each of the banks being refreshed.

7. The method of claim 6, wherein a row corresponding to the row address is simultaneously refresed in each of the banks before incrementing the counter.

8. The method of claim 6, a row corresponding to the row address is simultaneously refreshed in each of the banks before incrementing the counter.

9. A dynamic random access memory device comprising:
a memory cor including a plurality of addressable banks, wherein each addressable bank of the plurality of addressable banks includes dynamic memory cells;
a plurality of sense amplifiers coupled to the memory core, to refresh the dynamic memory cell in each addressable bank in response to self refresh command;
a refresh counter to generate row addresses corresponding to rows of the dynamic memory cells in each addressable bank to be refreshed, wherein the frequency at which the row addresses are generated is selectable in response to a control signal, wherein the frequency is selectable from at least a first refresh frequency and a second refresh frequency, wherein the first refresh frequency is lower than the second refresh frequency; and an oscillator coupled to the refresh counter to generate a clock signal that triggers refreshing of the rows of the dynamic memory cells in each addressable bank, wherein the frequency at which the row addresses are generated is selectable by changing the frequency of the clock signal in response to the control signal.

10. The dynamic random memory device of claim 9, wherein the row addresses are applied to each addressable bank.

11. The dynamic random memory device of claim 9, wherein the row addresses are applied simultaneously to each addressable bank.

12. The dynamic random access memory device of claim 9, wherein the row addresses are applied in sequence to each addressable bank.

13. The dynamic random access memory device of claim 9, further including a fuse, coupled to the oscillator, wherein the frequency of the clock signal is changed in response to the control signal by blowing the fuse.

14. The dynamic random access memory device of claim 9, further including a divider circuit coupled to the oscillator, wherein the frequency of the clock signal is changed by selecting, in response to the control signal, a divided version of an output of the oscillator.

15. A dynamic random access memory device comprising:
a memory core having a plurality of addressable banks, wherein each addressable bank of the plurality of addressable banks includes dynamic memory cells;
means for refreshing the dynamic memory cells in each addressable bank in response to a self refresh command;
means for generating row addresses corresponding to rows of the dynamic memory cells in each addressable bank to be refreshed, wherein the frequency at which row addresses are generated is selectable in response to a control signal, wherein the frequency is selectable from at least a first refresh frequency and a second refresh frequency, wherein the first refresh frequency is lower than the second refresh frequency; and
oscillating means for generating a clock signal that triggers refreshing of the rows of dynamic memory cells in each addressable bank, wherein the frequency at which the row addresses are generated is selectable by changing the frequency of the clock signal in response to the control signal.

16. The dynamic random access memory device of claim 15, wherein the row addresses are applied to each addressable bank.

17. The dynamic random access memory device of claim 15, wherein the row addresses are applied simultaneously to each addressable bank.

18. The dynamic random memory device of claim 15, wherein the row addresses are applied in sequence to each addressable bank.

19. The dynamic random access memory device of claim 15, further including means for generating the control signal to select the frequency at which the row addresses are generated.

20. The dynamic random access memory device of claim 15, further including a fuse, coupled to the oscillator means, wherein the frequency of the clock signal is changed in response to the control signal by blowing the fuse.

* * * * *

UNITED STATES PATENT AND TRADEMARK OFFICE
CERTIFICATE OF CORRECTION

PATENT NO. : 7,142,475 B2
APPLICATION NO. : 10/917748
DATED : November 28, 2006
INVENTOR(S) : Tsern et al.

It is certified that error appears in the above-identified patent and that said Letters Patent is hereby corrected as shown below:

In the Claims:

Column 8, line 64, after "claim", please insert --1--.

Column 9, line 12, after "claim 6,", please insert --wherein--.

Column 9, line 13, please delete "simultaneously" and insert --sequentially--.

Column 9, line 16, please delete "cor" and insert --core--.

Column 9, line 38, after "random", please insert --access--.

Column 9, line 41, after "random", please insert --access--.

Column 10, line 36, after "random", please insert --access--.

Signed and Sealed this

Third Day of April, 2007

JON W. DUDAS
*Director of the United States Patent and Trademark Office*